(12) United States Patent
Camps Raga et al.

(10) Patent No.: US 11,301,603 B2
(45) Date of Patent: Apr. 12, 2022

(54) HIGH-FIDELITY RADAR SIMULATOR

(71) Applicant: Aptiv Technologies Limited, St. Michael (BB)

(72) Inventors: Bruno F. Camps Raga, Westfield, IN (US); James F. Searcy, Westfield, IN (US)

(73) Assignee: Aptiv Technologies Limited, St. Michael (BB)

( * ) Notice: Subject to any disclaimer, the term of this patent is extended or adjusted under 35 U.S.C. 154(b) by 208 days.

(21) Appl. No.: 16/748,278

(22) Filed: Jan. 21, 2020

(65) Prior Publication Data
US 2021/0224436 A1 Jul. 22, 2021

(51) Int. Cl.
*G06F 30/20* (2020.01)
*G01S 7/40* (2006.01)

(52) U.S. Cl.
CPC ............ *G06F 30/20* (2020.01); *G01S 7/4052* (2013.01)

(58) Field of Classification Search
CPC ............................... G06F 30/20; G01S 7/4052
See application file for complete search history.

(56) References Cited

U.S. PATENT DOCUMENTS

| 10,014,583 B2 | 7/2018 | Lim et al. |
| 10,520,586 B2 | 12/2019 | Haghighi et al. |
| 2019/0041496 A1* | 2/2019 | Salvesen ............... G01S 7/4052 |
| 2019/0137603 A1* | 5/2019 | Peacock ................ G01S 7/4052 |
| 2020/0371206 A1* | 11/2020 | Glass .................... G01S 7/4052 |

OTHER PUBLICATIONS

Gadringer ME, Maier FM, Schreiber H, Makkapati VP, Gruber A, Vorderderfler M, Amschl D, Metzner S, Pflügl H, Bösch W, Horn M. Radar target stimulation for automotive applications. IET Radar, Sonar & Navigation. Sep. 20, 2018;12(10):1096-103. (Year: 2018).*
Gallee F, Appere C, Leroux D, Peden A, Ney M. Development of an automotive radar model for implementation in a real-time multi-sensor simulator. In2009 9th International Conference on Intelligent Transport Systems Telecommunications,(ITST) Oct. 20, 2009 (pp. 498-503). IEEE. (Year: 2009).*

(Continued)

*Primary Examiner* — Chuen-Meei Gan
(74) *Attorney, Agent, or Firm* — Sawtooth Patent Group PLLC

(57) ABSTRACT

Techniques and apparatuses are described that implement a high-fidelity radar simulator that performs operations associated with a radar system's hardware and/or software. The radar simulator can account for non-ideal characteristics within the radar system or environment and have an ability to process data from a variety of electromagnetic (EM) simulators. By using the radar simulator, an EM simulator can operate without specific information regarding the radar system's antenna response or signal generation. In this manner, the EM simulator can be decoupled from the radar system's design and operational configuration. Furthermore, the radar simulator can use the same environmental response data generated by the EM simulator to estimate performances of multiple radar systems. Use of the high-fidelity radar simulator enables problems to be efficiently discovered during design, integration, and testing phases of the radar system prior to performing a live test.

20 Claims, 6 Drawing Sheets

(56) References Cited

OTHER PUBLICATIONS

Patole SM, Torlak M, Wang D, Ali M. Automotive radars: A review of signal processing techniques. IEEE Signal Processing Magazine. Mar. 3, 2017;34(2):22-35. (Year: 2017).*
"Extended European Search Report", EP Application No. 21150683.7, dated Jun. 17, 2021, 9 pages.
Castro, et al., "Enabling Safe Autonomous Vehicles by Advanced mm-Wave Radar Simulations", Apr. 26, 2019, pp. 1476-1479.
Gadringer, et al., "Radar target stimulation for automotive applications", Aug. 2018, 8 pages.

* cited by examiner

HIGH-FIDELITY RADAR SIMULATOR

BACKGROUND

Radars are useful devices that can detect and track objects. Relative to other types of sensors, like a camera, a radar can provide improved performance in the presence of different environmental conditions, such as low lighting and fog, or with moving or overlapping objects. Accordingly, radar provides many advantages for autonomous-driving applications or driver-assistance applications.

While designing and developing a radar, engineers may perform live tests (e.g., real-time tests) to evaluate performance of the radar. Live tests, however, can be expensive and time-intensive. Additionally, these tests typically occur after design and implementation. As such, there can be a lot of rework and additional cost associated with addressing problems revealed by a live test.

SUMMARY

Techniques and apparatuses are described that implement a high-fidelity radar simulator. The radar simulator performs operations associated with a radar system's hardware and/or software. In particular, the radar simulator analyzes environmental response data provided by an electromagnetic (EM) simulator to generate a radar report. The radar report provides an estimation of the radar system's performance for a given environment simulated by the EM simulator. To improve the fidelity of the radar report, the radar simulator can account for non-ideal characteristics within the radar system or environment, including non-linearities and noise. Furthermore, the radar simulator can account for modulation and multiplexing schemes employed by the radar system. For additional flexibility, the radar simulator can be designed to operate with a variety of EM simulators.

By using the radar simulator, an EM simulator can operate without specific information regarding the radar system's antenna response or signal generation. In this manner, the EM simulator can be decoupled from the radar system's design and operational configuration. Furthermore, the radar simulator can use the same environmental response data generated by the EM simulator to estimate performances of multiple radar systems. Use of the high-fidelity radar simulator enables problems to be efficiently discovered during design, integration, and testing phases of the radar system, for example, prior to performing a live test.

Aspects described below include a method performed by a radar simulator. The method includes accepting environmental response data from an electromagnetic simulator. The environmental response data represents information from multiple propagation paths within a simulated environment. The method also includes generating channel response data based on the environmental response data. The channel response data comprises complex data for individual pulses of a simulated radar signal and for at least one transmit-receive channel pair of a simulated radar system. The complex data represents an integrated response of the simulated radar system to the multiple propagation paths within the simulated environment. The method additionally includes performing operations associated with a transceiver of the simulated radar system to generate radar samples based on the channel response data. The method further includes performing operations associated with a processor of the simulated radar system to generate a radar report based on the radar samples. The radar report represents performance of the simulated radar system within the simulated environment.

Aspects described below also include computer-readable storage media comprising computer-executable instructions that, responsive to execution by a processor, implement an interface module and a radar hardware simulator. The interface module is configured to accept environmental response data from an electromagnetic simulator. The environmental response data represents information from multiple propagation paths within a simulated environment. The interface module is also configured to generate channel response data based on the environmental response data. The channel response data comprises complex data for individual pulses of a simulated radar signal and for at least one transmit-receive channel pair of a simulated radar system. The complex data represents an integrated response of the simulated radar system to the multiple propagation paths within the simulated environment. The radar hardware simulator is configured to perform operations associated with a transceiver of the simulated radar system to generate radar samples based on the channel response data.

Aspects described below also include a system with means for simulating operations of a radar system's hardware and/or software.

This summary is provided to introduce simplified concepts of a high-fidelity radar simulator, which are further described below in the Detailed Description and Drawings. For ease of description, the disclosure focuses on automotive radar systems; however, the techniques are not limited to automobiles. The techniques also apply to radars of other types of vehicles, systems, and moving platforms. This summary is not intended to identify essential features of the claimed subject matter, nor is it intended for use in determining the scope of the claimed subject matter.

BRIEF DESCRIPTION OF THE DRAWINGS

The details of one or more aspects of a high-fidelity radar simulator are described in this document with reference to the following figures. The same numbers are used throughout the drawings to reference like features and components.

DETAILED DESCRIPTION

Overview

Figure 1:
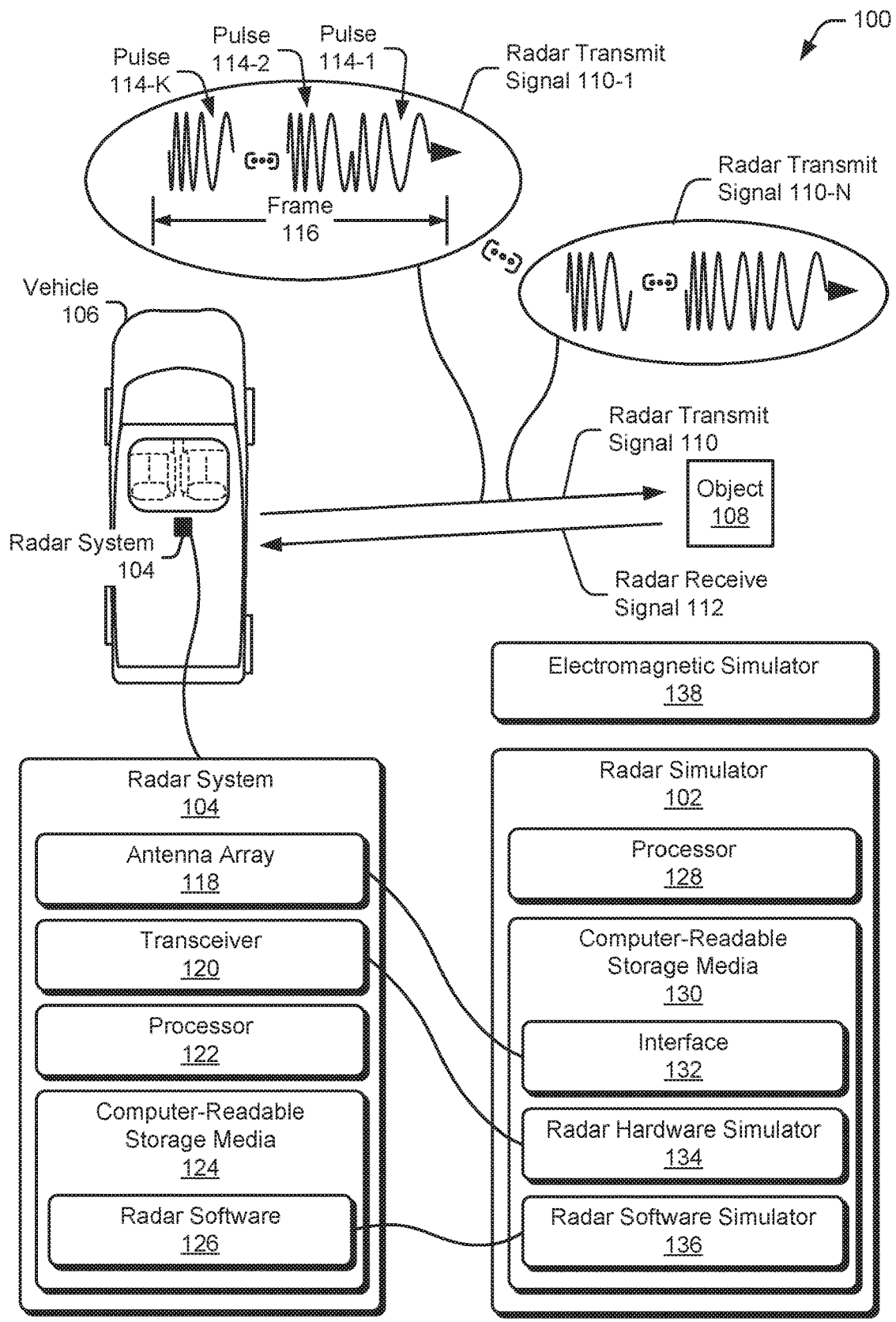
FIG. 1 illustrates an example environment in which a radar simulator models one or more components of a radar system.

While live tests can be used to verify and validate performance of a radar system, these tests can be expensive and time-intensive. Additionally, a live test may occur later in the development cycle of the radar system. As such, there can be a lot of rework and additional cost associated with addressing problems revealed by the live test.

To discover problems sooner in the development cycle, a simulation tool can be used to estimate performance of the radar system. Often times, the simulation tool is faster and cheaper to execute in comparison to a live test. An example type of simulation tool includes an electromagnetic (EM) simulator, which models the propagation and scattering of a radio-frequency signal within a given environment.

While the EM simulator can provide some insight regarding how radar signals propagate in different environments, it may not be able to provide a high-fidelity estimation of the radar system's performance. In some cases, the EM simulator generates an estimation of the radar system's response without considering characteristics of the radar system's transceiver or antenna array. The EM simulator may also be unable to model the effects of modulation or multiplexing schemes employed by the radar system. Consequently, an output of the EM simulator may not represent the hardware configuration, operational mode, or signal generation of the radar system. Some EM simulators may also assume ideal conditions and be unable to model the effects of phase noise or waveform non-linearities. In this case, the EM simulator's estimation of the radar system's performance may be optimistic, which can make it difficult to discover problems in the radar system's design.

To address these challenges, a high-fidelity radar simulator is described. The radar simulator performs operations associated with a radar system's hardware and/or software. In particular, the radar simulator analyzes environmental response data provided by an EM simulator to generate a radar report. The radar report provides an estimation of the radar system's performance for a given environment simulated by the EM simulator. To improve the fidelity of the radar report, the radar simulator can account for non-ideal characteristics within the radar system or environment, including non-linearities and noise. Furthermore, the radar simulator can account for modulation and multiplexing schemes employed by the radar system. For additional flexibility, the radar simulator can be designed to operate with a variety of EM simulators.

By using the radar simulator, an EM simulator can operate without specific information regarding the radar system's antenna response or signal generation. In this manner, the EM simulator can be decoupled from the radar system's design and operational configuration. Furthermore, the radar simulator can use the same environmental response data generated by the EM simulator to estimate performances of multiple radar systems. Use of the high-fidelity radar simulator enables problems to be efficiently discovered during design, integration, and testing phases of the radar system prior to performing a live test.

Example Environment

FIG. 1 illustrates an example environment 100 in which a radar simulator 102 models one or more components of a radar system 104. In the depicted environment 100, the radar system 104 is mounted to, or integrated within, a vehicle 106. The radar system 104 is capable of detecting one or more objects 108 that are proximate to the vehicle 106 and associated with a signal-to-noise ratio that is greater than a detection threshold of the radar system 104. Although illustrated as a car, the vehicle 106 can represent other types of motorized vehicles (e.g., a motorcycle, a bus, a tractor, a semi-trailer truck, or construction equipment), types of non-motorized vehicles (e.g., a bicycle), types of railed vehicles (e.g., a train or a trolley car), watercraft (e.g., a boat or a ship), aircraft (e.g., an airplane or a helicopter), or spacecraft (e.g., satellite). In some cases, the vehicle 106 can tow, or include, a trailer or other attachments. In general, the radar system 104 can be mounted to any type of moving platform, including moving machinery or robotic equipment.

In the depicted implementation, the radar system 104 is mounted on top of the vehicle 106. In other implementations, the radar system 104 can be mounted to an underside, a front side, a backside, a left side, or a right side of the vehicle 106. In some cases, the vehicle 106 includes multiple radar systems 104, such as a first rear-mounted radar system 104 positioned near a left side of the vehicle 106 and a second rear-mounted radar system 104 positioned near a right side of the vehicle 106. In general, locations of the one or more radar systems 104 can be designed to provide a particular field of view that encompasses a region of interest in which the object 108 may be present. Example fields of view include a 360-degree field of view, one or more 180-degree fields of view, one or more 90-degree fields of view, and so forth, which can overlap (e.g., four 120-degree fields of view).

The object 108 is composed of one or more types of material that reflect radar signals. Depending on the application, the object 108 can represent a target of interest or clutter. In some cases, the object 108 is a moving object, such as another vehicle, a human, or an animal. In other cases, the object 108 is a stationary object, such as a continuous or discontinuous road barrier (e.g., a traffic cone, a concrete barrier, a guard rail, or a fence), a tree, or a parked vehicle.

The vehicle 106 can implement one or more radar-based systems, which utilize data provided by the radar system 104. Example types of radar-based systems include a driver-assistance system or an autonomous-driving system. Using the data provided by the radar system 104, the driver-assistance system can monitor one or more blind spots of the vehicle 106 and alert a driver to a potential collision with the object 108. The autonomous-driving system can move the vehicle 106 to a location while analyzing data provided by the radar system 104 to avoid collisions with other objects 108, perform emergency braking, change lanes, or adjust the vehicle 106's speed.

The radar system 104 can be implemented as a continuous-wave or pulsed radar, a frequency-modulated or phase-modulated radar, a single-input single-output (SISO) or a multiple-input multiple-output (MIMO) radar, or some combination thereof. In the depicted configuration, the radar system 104 is implemented as a frequency-modulated continuous-wave (FMCW) MIMO radar, which employs a code-division multiple access (CDMA) scheme. To detect the object 108, the radar system 104 transmits at least one radar transmit signal 110. At least a portion of the radar transmit signal 110 is reflected by the object 108. This reflected portion represents a radar receive signal 112. The radar system 104 receives the radar receive signal 112 and processes the radar receive signal 112 to provide data for the vehicle 106's radar-based system.

At the radar system 104, the radar receive signal 112 represents a delayed version of the radar transmit signal 110. The amount of delay is proportional to the slant range (e.g., distance) from the radar system 104 to the object 108. In particular, this delay represents a time it takes the radar transmit signal 110 to propagate from the radar system 104 to the object 108 and a time it takes the radar receive signal 112 to propagate from the object 108 to the radar system 104. If the object 108 and/or the radar system 104 is moving, the radar receive signal 112 is shifted in frequency relative to the radar transmit signal 110 due to the Doppler effect. In other words, characteristics of the radar receive signal 112 are dependent upon motion of the object 108 and/or motion of the vehicle 106.

As an example, the radar transmit signal 110 and the radar receive signal 112 can both have frequencies between one and four hundred gigahertz (GHz), between four and one hundred GHz, or between approximately seventy and eighty GHz. Example bandwidths of these signals can be on the order of several gigahertz or hundreds of megahertz (MHz), such as between approximately three hundred MHz and five hundred MHz.

In this example, the radar transmit signal 110 and the radar receive signal 112 are composed of multiple signals that have distinct waveforms to support MIMO operations. For example, the radar transmit signal 110 is composed of a first radar transmit signal 110-1 and an Nth radar transmit signal 110-N, where "N" represents a positive integer. Each radar transmit signal 110-1 to 110-N includes multiple pulses 114-1 to 114-K, where "K" represents a positive integer. Likewise, each radar receive signal 112 includes the multiple pulses 114-1 to 114-K.

Individual frequencies of the pulses 114-1 to 114-K can increase or decrease over time. In the depicted example, the radar system 104 employs a single-slope cycle to linearly increase the frequencies of the pulses 114-1 to 114-K over time. Other types of frequency modulations are also possible, including a two-slope cycle and/or a non-linear frequency modulation. The quantity of pulses ("K") within a frame 116 (or scan) and transmission characteristics of the pulses 114-1 to 114-K (e.g., bandwidth, center frequency, duration, and transmit power) can be tailored to achieve a particular detection range, range resolution, or doppler resolution for detecting the object 108.

In this example, the radar system 104 transmits the pulses 114-1 to 114-K in a continuous sequence to implement a continuous-wave radar. Alternatively, the radar system 104 can implement a pulsed radar, which transmits time-separated pulses 114-1 to 114-K. The radar transmit signal 110 can include multiple frames 116 (e.g., multiple sets of pulses 114-1 to 114-K). As an example, the quantity of pulses ("K") within the frame 116 can be on the order of several tens of chirps (e.g., "K" can equal 32, 64, or 128). A duration of the frame 116 can be on the order of milliseconds (ms), such as approximately 8 ms, 15 ms, or 30 ms. The multiple pulses 114-1 to 114-K enable the radar system 104 to make multiple observations of the object 108 over a time period of the frame 116.

The radar system 104 can also employ multiple-access techniques to support MIMO operations. Example multiple-access techniques include time-division multiple access (TDMA) or code-division multiple access (CDMA). For TDMA, the radar system 104 delays the transmission of the radar transmit signals 110-1 to 110-N by different amounts so that each can occur within a separate time slot. For CDMA, the radar system 104 encodes the radar transmit signals 110-1 to 110-N using respective coding sequences that are orthogonal to each other. For example, a first coding sequence that is used to generate the radar transmit signal 110-1 causes a phase of the second pulse 114-2 to be offset by 180 degrees from the phase of the first pulse 114-1. In contrast, a second coding sequence that is used to generate the radar transmit signal 110-2 causes a phase of the second pulse 114-2 to be offset by zero degrees from the phase of the first pulse 114-1.

To transmit the radar transmit signal 110 and receive the radar receive signal 112, the radar system 104 includes at least one antenna array 118 and at least one transceiver 120.

The antenna array 118 includes at least one transmit antenna element and at least one receive antenna element. To implement the MIMO radar, the antenna array 118 includes multiple subarrays of transmit antenna elements and receive antenna elements. The MIMO radar can include "N" transmitting subarrays, which respectively transmit the radar transmit signals 110-1 to 110-N during a same time interval. Additionally, the MIMO radar can include "M" receiving subarrays, which respectively receive reflected versions of the radar transmit signals 110-1 to 110-N. The quantity of transmitting subarrays ("N") and the quantity of receiving subarrays ("M") can be similar or different. The antenna elements within the antenna array 118 can be circularly polarized, horizontally polarized, vertically polarized, or some combination thereof.

Using the antenna array 118, some implementations of the radar system 104 can form beams that are steered or un-steered, and wide or narrow. The steering and shaping can be achieved through analog beamforming or digital beamforming. The one or more transmitting subarrays can have, for instance, an un-steered omnidirectional radiation pattern or can produce a wide steerable beam to illuminate a large volume of space. To achieve target angular accuracies and angular resolutions, the receiving subarrays can include multiple receive antenna elements to generate hundreds of narrow steered beams with digital beamforming. In this way, the radar system 104 can efficiently monitor an external environment and detect one or more objects 108 within a region of interest.

The transceiver 120 includes circuitry and logic for transmitting and receiving radar signals via the antenna array 118. Components of the transceiver 120 can include amplifiers, mixers, switches, analog-to-digital converters, or filters for conditioning the radar signals. The transceiver 120 also includes logic to perform in-phase/quadrature (I/Q) operations, such as modulation or demodulation. The transceiver 120 can include at least transmitter and at least one receiver.

To implement the MIMO radar system, the transceiver 120 can include "N" transmitters, which are respectively coupled to the transmitting subarrays of the antenna array 118. Each transmitter can include multiple transmit chains, which are respectively coupled to the transmit antenna elements of the transmitting subarray. Each transmitter generates one of the radar transmit signals 110-1 to 110-N. The multiple transmit chains of each transmitter enable beamforming techniques to adjust a beam shape or direction associated with the transmitted radar transmit signal 110.

The transceiver 120 can also include "M" receivers, where "M" represents a positive integer that may or may not be equal to "N." The receivers are respectively coupled to the "M" receiving subarrays of the antenna array 118. Each receiver can include multiple receive chains, which are respectively coupled to the receive antenna elements of the receiving subarray. Each receiver receives one or more reflected versions of the radar transmit signals 110-1 to 110-N. The multiple receive chains of each receiver enable beamforming techniques to individually adjust amplitudes and/or phases of signals that are processed by the receive chains.

Generally, each transmitting subarray of the antenna array 118 and associated transmitter of the transceiver 120 form a transmit channel. Additionally, each receiving subarray of the antenna array 118 and associated receiver of the transceiver 120 form a receive channel. The quantity of transmit channels and receive channels can be similar or different. The transmit channels and the receive channels can be combined in different ways to form multiple transmit-receive channel pairs. For example, a first transmit channel and a first receive channel form a first transmit-receive channel pair. As another example, a second transmit channel and the first receive channel form a second transmit-receive channel pair.

The radar system 104 also includes one or more processors 122 and computer-readable storage media (CRM) 124. The CRM 124 includes radar software 126 for analyzing the radar receive signal 112, detecting the object 108, and determining one or more characteristics (e.g., position or velocity) of the object 108.

The radar simulator 102 models hardware and/or software of the radar system 104 to enable performance of the radar system 104 to be evaluated for a given simulated environment. Throughout a development cycle of the radar system 104, the radar simulator 102 can be used to evaluate different system designs (e.g., different hardware configurations or different operational modes), test different versions of the radar software 126, or verify requirements, for instance. Use of the radar simulator 102 enables design or implementation problems within the radar system 104 to be quickly discovered during design, integration, and testing phases prior to performing a live test.

The radar simulator 102 performs operations to simulate the hardware of the radar system (e.g., parts of the antenna array 118 and/or transceiver 120), the radar software 126 executed by the processor 122, or a combination thereof. The radar simulator 102 can also account for non-ideal characteristics of the radar system 104 or the environment 100, such as noise or non-linearities. In particular, the radar simulator 102 can model phase noise, waveform non-linearities, and uncorrelated noise within the transceiver 120. With these capabilities, the radar simulator 102 can have a similar noise floor and dynamic range as the radar system 104.

The radar simulator 102 includes at least one processor 128 and computer-readable storage media 130. The CRM 130 can be implemented by one or more memory devices that enable persistent and/or non-transitory data storage. In some cases, the processor 128 and the CRM 130 are packaged together within an integrated circuit or on a printed circuit board. In other cases, the processor 128 and the CRM 130 can be implemented separately and operationally coupled together such that the processor 128 can access instructions stored by the CRM 130.

The CRM 130 includes at least one interface module 132 and at least one radar hardware simulator 134. Optionally, the CRM 130 can also include at least one radar software simulator 136. The interface module 132, the radar hardware simulator 134, and the radar software simulator 136 can be implemented using hardware, software, firmware, or a combination thereof. In this example, the processor 128 implements the interface module 132, the radar hardware simulator 134, and the radar software simulator 136.

Figure 2:
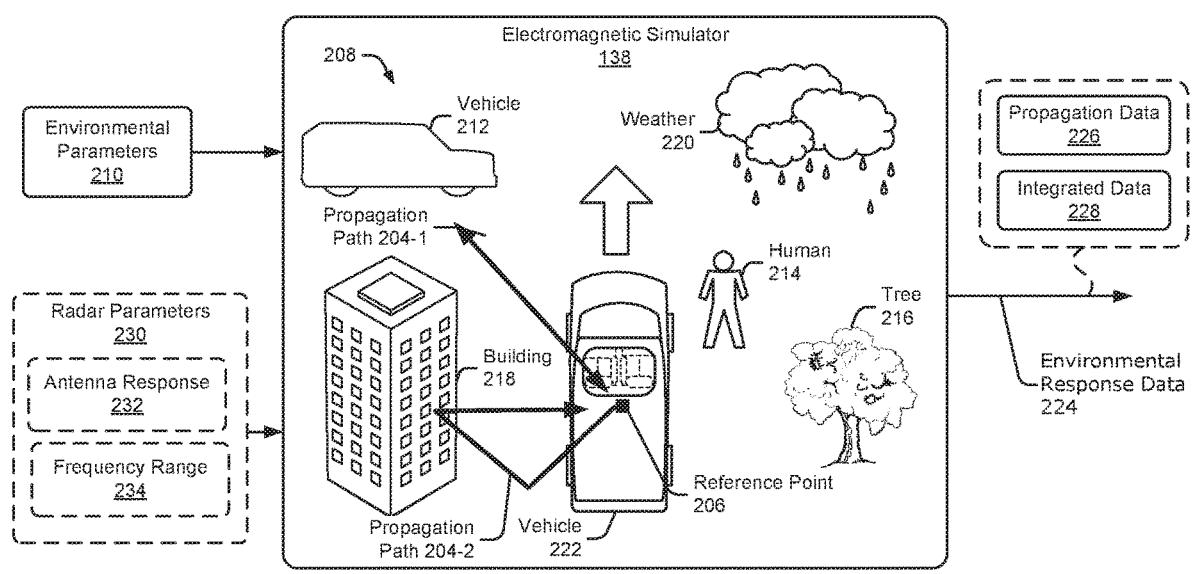
FIG. 2 illustrates an example electromagnetic simulator.

The interface module 132 enables the radar simulator 102 to process environmental response data provided by an electromagnetic simulator (shown in FIG. 2). Generally, the interface module 132 transforms the environmental response data into a form that is useable by the radar hardware simulator 134. In some cases, the interface module 132 adjusts the environmental response data to account for an antenna response of the antenna array 118.

The radar hardware simulator 134 models the transceiver 120. In particular, the radar hardware simulator 134 performs operations that simulate waveform generation, modulation, demodulation, multiplexing, amplification, frequency conversion, filtering, and/or analog-to-digital conversion operations performed by the transceiver 120. In other words, the radar hardware simulator 134 performs operations of the transceiver 120, which occur between the processor 122 and the antenna array 118. The radar hardware simulator 134 can account for the radar system's 104 dynamic range, as well as the presence of non-linear effects and noise. The radar hardware simulator 134 can be used to verify different hardware configurations and operational modes of the radar system 104.

The radar software simulator 136 models the radar software 126 of the radar system 104. In particular, the radar software simulator 136 performs digital baseband processing operations that simulate operations performed by the processor 122. These operations can include Fourier transforms (e.g., Fast Fourier transform), noise floor estimation, clutter map generation, constant-false alarm rate thresholding, object detection, and object position estimation (e.g., digital beamforming). In some cases, the radar software simulator 136 includes a version of the radar software 126. In this way, the radar simulator 102 can be used to verify software requirements and evaluate different software versions of the radar system 104.

During operation, the radar simulator 102 accepts environmental response data from an EM simulator 138 and generates a radar report. The radar report can be used to evaluate performance of the radar system 104 for a given simulated environment. The EM simulator 138 is further described with respect to FIG. 2.

FIG. 2 illustrates an example electromagnetic (EM) simulator 138, which evaluates the propagation and scattering effects of a simulated electromagnetic signal, such as a radio-frequency signal. Example types of electromagnetic simulators 138 include CarMaker™ and ANSYS™. In general, the electromagnetic simulator 138 evaluates one or more propagation paths 204 that originate from a reference point 206 and return to the reference point 206 within a simulated environment 208. Example types of propagation paths 204 can include a direct line-of-sight path 204-1 or an indirect path 204-2 associated with multipath propagation. In some cases, the electromagnetic simulator 138 uses ray tracing to determine the various propagation paths 204.

During operation, the EM simulator 138 determines characteristics of the different propagation paths 204 within the simulated environment 208. In particular, the EM simulator 138 accepts one or more environmental parameters 210, which specify characteristics of one or more simulated objects (e.g., positions, velocities, and/or material composition of the simulated objects). The electromagnetic simulator 138 generates the simulated environment 208 based on the environmental parameters 210.

As an example, the simulated environment 208 includes simulated versions of a vehicle 212, a human 214, a tree 216, and a building 218. The environmental parameters 210 can also enable the electromagnetic simulator 138 to simulate different types of weather 220, terrain, road geometries, traffic rules, and traffic conditions. In some cases, the environmental parameters 210 specify motion of the reference point 206. In the simulated environment 208, the reference point 206 represents a location on a simulated vehicle 222, which can correspond to the location of the radar system 104 on the vehicle 106 of FIG. 1.

The EM simulator 138 generates environmental response data 224, which can vary over time as the reference point 206 or the objects within the simulated environment 208 move. The environmental response data 224 can include complex data with amplitude, phase, and frequency information. Depending on the type of EM simulator, the EM simulator 138 may rely on information regarding the radar system 104 to generate the environmental response data 224. Example types of information regarding the radar system 104 can include a maximum operation frequency of the radar system 104 to estimate the spatial resolution of the radar system 104 and/or a pulse-repetition frequency (PRF) of the radar system 104 to determine an unambiguous range of the radar system 104.

As an example, the EM simulator 138 uses ray tracing to generate the environmental response data 224. To improve efficiency, the rays can be transmitted and received from the reference point 206, which can represent a center of the radar system 104. Additionally, the EM simulator 138 can assume that the antenna array 118 has an omnidirectional pattern for both transmission and reception. In this way, the ray tracing can be performed without considering separate transmit-receive channel pairs or differences between individual subarrays of the antenna array 118.

Some EM simulators 138 provide propagation data 226 as the environmental response data 224. The propagation data 226 includes a list of propagation paths 204 (e.g., rays) and characteristics of electromagnetic signals that propagate along the propagation paths 204. These characteristics can include relative amplitude, Doppler-frequency shift, time of flight, or angles of departure and arrival. In this example, the EM simulator 138 can generate the propagation data 226 without relying on information regarding the radar system 104.

Other EM simulators 138 can provide integrated data 228 as the environmental response data 224. Instead of including information regarding individual propagation paths 204, the integrated data 228 represents a combined environmental response resulting from the multiple propagation paths 204 for at least one transmit-receive channel pair. To generate the integrated data 228, the EM simulator 138 accepts radar parameters 230 during operation. The radar parameters 230 provide information regarding the radar system 104 or the radar transmit signal 110. As an example, the radar parameters 230 include an antenna response 232 associated with the antenna array 118 and/or a frequency range associated with the radar transmit signal 110.

The antenna response 232 enables the EM simulator 138 to account for characteristics of the antenna array 118, including antenna patterns for one or more subarrays, relative spacing between the subarrays and the reference point 206, and antenna element spacing within the subarray. Using the frequency range 234, the EM simulator 138 can estimate propagation losses for various frequencies. If the radar parameters 230 are not available, the EM simulator 138 can utilize a set of default radar parameters to generate the integrated data 228. The default radar parameters may specify an ideal antenna response or ideal waveform characteristics. The EM simulator 138 passes the environmental response data 224 to the radar simulator 102 (of FIG. 1), as further described with respect to FIG. 3.

Figure 3:
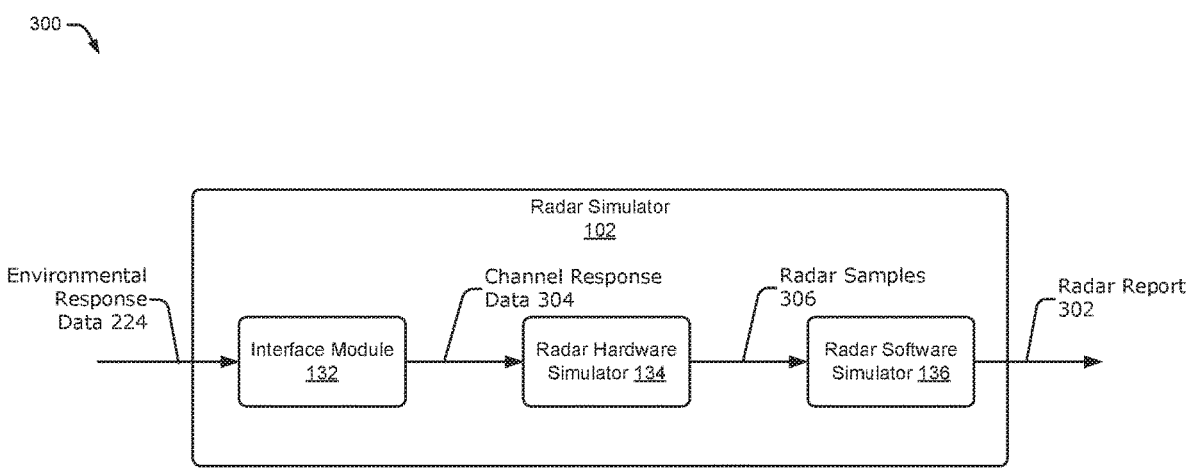
FIG. 3 illustrates an example sequence flow diagram of a radar simulator.

FIG. 3 illustrates an example sequence flow diagram 300 of the radar simulator 102. During operation, the radar simulator 102 analyzes the environmental response data 224 and generates a radar report 302, which can be used to evaluate the performance of the radar system 104 for the simulated environment 208 (of FIG. 2). Different types of radar reports 302 are possible. In general, the radar report 302 represents any type of data that can be generated by the radar system 104. This can include samples of signals received by the transceiver 120, information processed by the processor 122, or information passed to a radar-based system of the vehicle 106.

To generate the radar report 302, the interface module 132 generates channel response data 304 based on the environmental response data 224. The channel response data 304 is in a form that is useable by the radar hardware simulator 134. In some implementations, the radar simulator 102 includes multiple interface modules 132, which are designed to transform environmental response data 224 associated with different EM simulators 138. For example, a first interface module 132 is enabled to transform environmental response data 224 generated by CarMaker™. Similarly, a second interface module 132 is enabled to transform environmental response data 224 generated by ANSYS™. In this way, the radar simulator 102 is compatible with multiple EM simulators 138, which can generate different types of environmental response data 224.

The channel response data 304 represents an integrated response of the radar system 104 to the multiple propagation paths 204 within the simulated environment 208. In particular, the channel response data 304 includes a matrix of complex data for individual pulses 114 and individual transmit-receive channel pairs. The channel response data 304 can include channel impulse response data (e.g., time-domain data) or channel frequency response data (e.g., frequency-domain data).

To transform the environmental response data 224 into a format that is useable by the radar hardware simulator 134, the interface module 132 may perform a variety of different operations. These operations can include data re-arrangement, scaling, quantization, weighting, and phase shifting. Consider an example in which the environmental response data 224 includes the integrated data 228 (of FIG. 2). In this case, the interface module 132 can re-arrange the integrated data 228 such that information associated with different transmit-receive channel pairs appears in an expected order. Additionally or alternatively, the interface module 132 scales the integrated data 228 so that the data is in an expected unit of measurement.

In another example, the environmental response data 224 includes the propagation data 226 (of FIG. 2). In this case, the interface module 132 quantizes the propagation data 226 into delay bins. Instead of determining the quantity of delay bins based on the range resolution of the radar system 104, the interface module 132 determines the quantity of delay bins based on a sampling frequency that can represent the radar transmit signal 110 without losing information. As an example, the sampling frequency can represent a Nyquist frequency, which is twice a maximum frequency of a simulated radar transmit signal. In this way, the radar simulator 102 can generate the channel response data 304 with a higher resolution, which enables the radar hardware simulator 134 to process the channel response data 304 and improves a fidelity of the radar simulator 102.

The interface module 132 generates an integrated response of the quantized propagation data 226 for each pulse 114 of the simulated radar signal and for each transmit-receive channel pair. In particular, the interface module 132 weights the quantized propagation data 226 by the complex radiation pattern of the transmitting subarray and receiving subarray of the antenna array 118. The complex radiation pattern includes a complex gain pattern for a direction of departure and a direction of arrival of the propagation path 204. Each subarray can have a unique magnitude and phase patterns for these specific angles due to variations in antenna element spacing and variations in performance of each antenna element. Additionally, the interface module 132 applies phase shifts based on the relative position of each subarray relative to the reference point 206. By performing the above operations, the interface module 132 generates channel response data 304 for one pulse 114 of a simulated radar signal for each transmit-receive channel pair.

By using the propagation data 226, the interface module 132 can dynamically determine the channel response data 304 for different radar system 104 that have different quantities of transceiver channels or utilize different frequencies. In this way, the EM simulator 138 doesn't need to execute multiple times in order, which saves time while evaluating different types of radar systems 104.

To generate the channel response data 304 for additional pulses 114 within a frame 116 of the simulated radar signal, the interface module 132 applies additional phase shifts based on the center frequency of the simulated radar signal, the Doppler shift obtained for each propagation path 204, and the pulse-repetition frequency of the radar system 104. In other words, the channel response data 304 for subsequent pulses 114 is based on the Doppler information within the propagation data 226 and the timing between adjacent pulses (e.g., the inter-pulse period (IPP)). Other phase shifts can also be added to individual samples within a pulse 114 based on the above sampling frequency. In some implementations, the interface module 132 uses multithreading to compute the channel response data 304 for multiple pulses 114 in parallel.

The interface module 132 can transform the environmental response data 224 between the time domain or frequency domain, depending on an expected domain of the radar hardware simulator 134. Alternatively, the operations performed by the radar hardware simulator 134 and the radar software simulator 136 can be tailored to operate in a domain of the environmental response data 224. In this way, time-intensive transformation operations can be avoided.

The radar hardware simulator 134 generates radar samples 306 based on the channel response data 30. In particular, the radar hardware simulator 134 performs operations associated with the transceiver 120 to generate the radar samples 306. The radar samples 306 represent samples of one or more simulated radar receive signals. Operations of the radar hardware simulator 134 are further described with respect to FIG. 4.

The radar software simulator 136 generates the radar report 302 based on the radar samples 306. In this case, the radar report 302 represents data generated by the radar software simulator 136, such as a radar data cube, an indication of whether or not an object is detected, information regarding a detected object (e.g., position information or velocity information), and so forth. If the radar simulator 102 does not include the radar software simulator 136, the radar report 302 can include any other type of intermediate data generated by the radar hardware simulator 134, such as the radar samples 306.

The EM simulator 138 (of FIG. 2) and the radar simulator 102 can operate together or separately. In a first example, the EM simulator 138 is operationally coupled to the radar simulator 102. During operation, the EM simulator 138 passes the environmental response data 224, which is associated with a first time interval, directly to the radar simulator 102. The radar simulator 102 processes the environmental response data 224 and generates the radar report 302 associated with the first time interval. This process repeats for subsequent time intervals. In general, each time interval is associated with a frame 116 of a simulated radar signal. By operating the EM simulator 138 and the radar simulator 102 together, the radar simulator 102 can immediately evaluate the environmental response data 224 as it becomes available.

In a second example, the EM simulator 138 and the radar simulator 102 operate separately. Firstly, the EM simulator 138 generates the environmental response data 224 for the simulated environment 208. The environmental response data 224 is recorded to a storage memory, such as the computer-readable storage media 130 of the radar simulator 102 (shown in FIG. 1). In this case, the environmental response data 224 is associated with multiple time intervals. At a later time, the radar simulator 102 accesses the storage memory and analyzes the environmental response data 224 offline. This configuration can be beneficial for environments that are complex and require additional time to simulate. By storing the environmental response data 224, the EM simulator 138 can be executed once, and the environmental response data 224 can be reused for multiple tests with the radar simulator 102.

Figure 4:
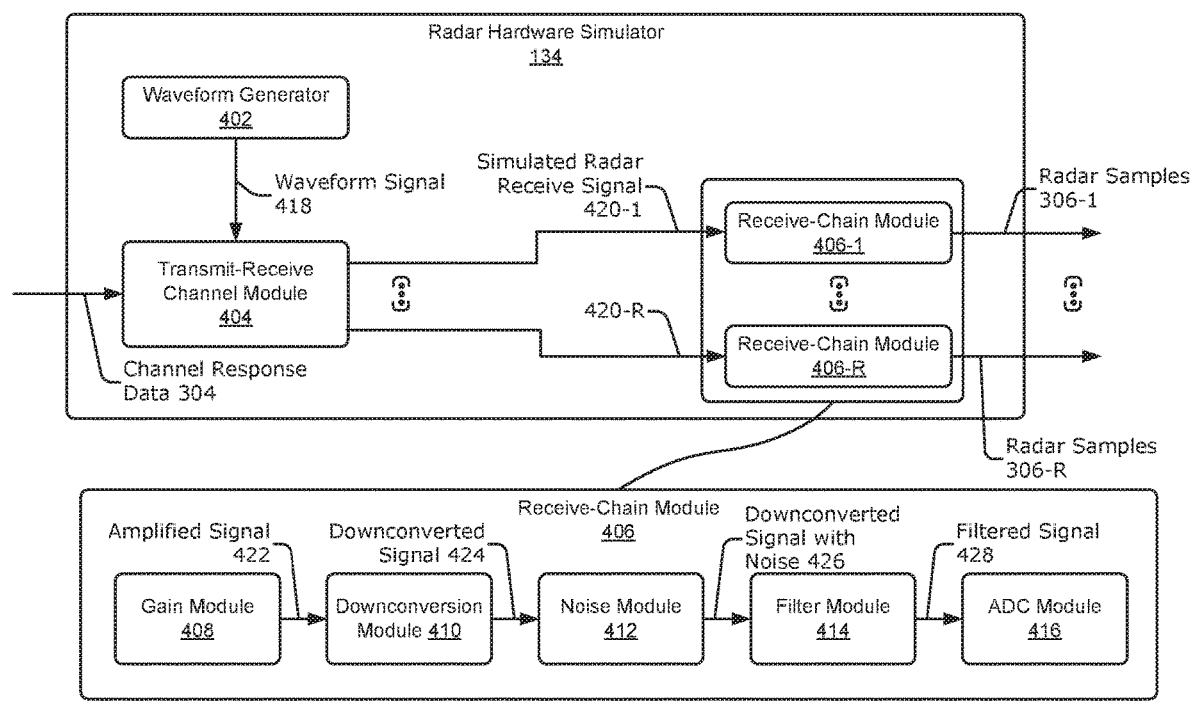
FIG. 4 illustrates an example radar hardware simulator.

FIG. 4 illustrates an example radar hardware simulator 134. In the depicted configuration, the radar hardware simulator 134 includes at least one waveform generator 402, at least one transmit-receive channel module 404, and at least one receive-chain module 406. The waveform generator 402 can simulate a voltage-controlled oscillator of the radar system 104, or some other type of signal generator.

The transmit-receive channel module 404 is coupled to the waveform generator 402 and the interface module 132 (of FIG. 3). The transmit-receive channel module 404 applies any modulation or multiplexing schemes to the waveform signal 418. This enables the transmit-receive channel module 404 generate simulated radar transmit signals that are time-delayed or phase-coded according to the scheme employed by the radar system 104. In general, the transmit-receive channel module 404 combines the simulated radar transmit signals from all transmit channels to form an individual MIMO receive channel.

The transmit-receive channel module 404 generates simulated radar receive signals 420-1 to 420-R based on the waveform signal 418 and the channel response data 304, where "R" represents a positive integer. In some implementations, this operation is performed in the frequency domain for efficiency. The simulated radar receive signals 420-1 to 420-R represent an output of receive antenna elements of one or more receiving subarrays.

In the depicted configuration, the radar hardware simulator 134 includes multiple receive-chain modules 406-1 to 406-R. The receive-chain modules 406-1 to 406-R model receive chains within the transceiver 120, which can be associated with the same receiver or different receivers. Each receive-chain module 406 can include a gain module 408, a downconversion module 410, a noise module 412, a filter module 414, an analog-to-digital converter (ADC) module 416, or some combination thereof.

The gain module 408 simulates an amplifier within a receive chain of the transceiver 120, such as a low-noise amplifier. The downconversion module 410 simulates a downconversion mixer within the receive chain of the transceiver 120. The noise module 412 generates random noise to simulate internal or external noise that affects the receive chain of the transceiver 120. The filter module 414 simulates a filter within the receive chain, such as a bandpass filter or a low-pass filter. The ADC module 416 simulates an analog-to-digital converter within the receive chain.

During operation, the waveform generator 402 generates a waveform signal 418, which represents a waveform generated by the radar system 104. The waveform signal 418 is a discrete-time signal, which can be modulated in frequency or phase. As an example, the waveform signal 418 is a linear frequency-modulated signal that includes multiple pulses 114. Other types of modulations are possible, including a single-slope frequency-modulation, a two-slope frequency modulation, a stepped-frequency modulation, a non-linear frequency modulation, a phase modulation, and so forth. The waveform generator 402 can also incorporate non-linearities and/or phase noise into the waveform signal 418.

In some examples, the waveform generator 402 has access to a recorded waveform of the radar system 104 and provides the recorded waveform as the waveform signal 418. The waveform generator 402 can dynamically provide different types of waveform signals 418 based on the operational mode of the radar hardware simulator 134. In some implementations, the operational mode is dynamically adjusted by the radar software simulator 136. As an example, the characteristics of the waveform signal 418 (e.g., bandwidth, pulse width, pulse-repetition frequency, quantity of pulses, frequency-modulation) can change as the radar software simulator 136 searches or tracks a simulated object. The waveform generator 402 can also introduce the non-linearities and phase noise based on a particular implementation of transceiver 120. Generally, the CRM 130 of FIG. 1 can store information that enables the waveform generator 402 to generate the waveform signal 418.

The transmit-receive channel module 404 generates simulated radar receive signals 420-1 to 420-R based on the channel response data 304 and the waveform signal 418. In particular, the transmit-receive channel module 404 adjusts the channel response data 304 associated with different transmit-receive channel pairs to implement multiple-access schemes. For TDMA, the transmit-receive channel module 404 can apply different delays across the different simulated radar transmit signals. For CDMA, the transmit-receive channel module 404 modulates phases of the pulses 114 within the simulated radar transmit signals.

The receive-chain modules 406-1 to 406-R generate radar samples 306-1 to 306-R based on the simulated radar receive signals 420-1 to 420-R. In particular, the gain module 408 amplifies the simulated radar receive signal 420 to generate the amplified signal 422. The downconversion module 410 performs a beating operation to generate the downconverted signal 424. The beating operation downconverts and demodulates the amplified signal 422 using one of the simulated radar transmit signals. The noise module 412 injects random noise into the downconverted signal 424 to generate a downconverted signal with noise 426. As each receive-chain module 406-1 to 406-R independently generates the noise, the noise that is applied across the receive-chain modules 406-1 to 406-R is uncorrelated. The filter module 414 filters the downconverted signal with noise 426 to generate the filtered signal 428. The analog-to-digital converter module 416 samples and quantizes the filtered signal 428 to generate the radar samples 306. The ADC module 416 can operate with a same sampling rate as the radar system 104's analog-to-digital converter. This enables the radar simulator 102 to have a same dynamic range as the radar system 104.

The radar samples 306-1 to 306-R include samples of the pulses 114 for each frame 116. The radar samples 306-1 to 306-R can be in a format that is used within the radar system 104. For example, the radar samples 306-1 to 306-R can be a 3D matrix of dimensions "R," "S," and "K," where "R" represents the quantity of receive chains, "S" represents the quantity of ADC samples, and "K" represents the quantity of pulses within the frame 116. The radar samples 306-1 to 306-R are provided to the radar software simulator 136 (of FIG. 3). The radar software simulator 136 analyzes the radar samples 306-1 to 306-R to generate the radar report 302, as further described with respect to FIG. 5.

Figure 5:
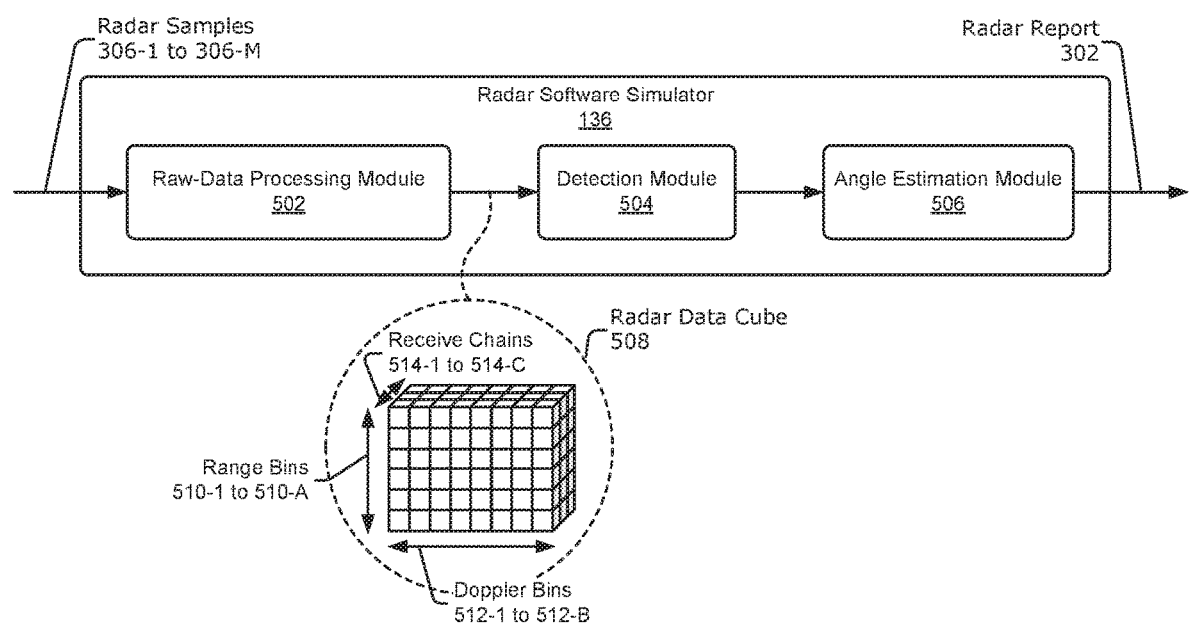
FIG. 5 illustrates an example radar software simulator.

FIG. 5 illustrates an example radar software simulator 136. In the depicted configuration, the radar software simulator 136 implements a raw-data processing module 502, a detection module 504, and an angle estimation module 506. The raw-data processing module 502 performs one or more operations to generate at least one radar data cube 508 based on the radar samples 306-1 to 306-R. As an example, the raw-data processing module 502 can perform one or more Fourier transform operations, such as a Fast Fourier Transform (FFT) operation. Over time, the raw-data processing module 502 generates multiple radar data cubes 508 for respective frames 116 of the radar receive signal 112. If the radar samples 306-1 to 306-R are associated with different receive channels, the raw-data processing module 502 can generate radar data cubes 508 for each receive channel.

The radar data cube 508 includes amplitude and/or phase information (e.g., in-phase and quadrature components) associated with different range bins 510-1 to 510-A, Doppler bins 512-1 to 512-B, and receive channels 514-1 to 514-C, where "A," "B," and "C," represent positive integers that may or may not be equal to each other. In other words, the radar data cube 508 comprises multiple range-Doppler maps for each receive chain associated with a receive channel. If the radar simulator 102 simulates a MIMO radar system, different radar data cubes 508 can contain data for different transmit-receive channels. In this case, "C" can represent different transmit-receive channels.

The detection module 504 and/or the angle estimation module 506 process the radar data cube 508. For example, the detection module 504 can apply constant-false-alarm-rate (CFAR) thresholding to identify one or more detections within the radar data cube 508. The angle estimation module 506 can employ digital beamforming techniques to determine an angular position associated with the one or more detections. The radar report 302 generated by the radar software simulator 136 can include the radar data cube 508, information generated by the detection module 504, or information generated by the angle estimation module 506. The radar report 302 provides an estimation of the radar system 104's performance within the simulated environment.

In some cases the radar simulator 102 is operatively coupled to the radar-based system of the vehicle 106 (not shown) or a vehicle simulator (not shown). As such, the radar software simulator 136 can pass the radar report 302 to either of these entities. This can enable the radar-based system to be tested using simulated radar data or enable the vehicle simulator to operate with simulated radar data.

Example Method

Figure 6:
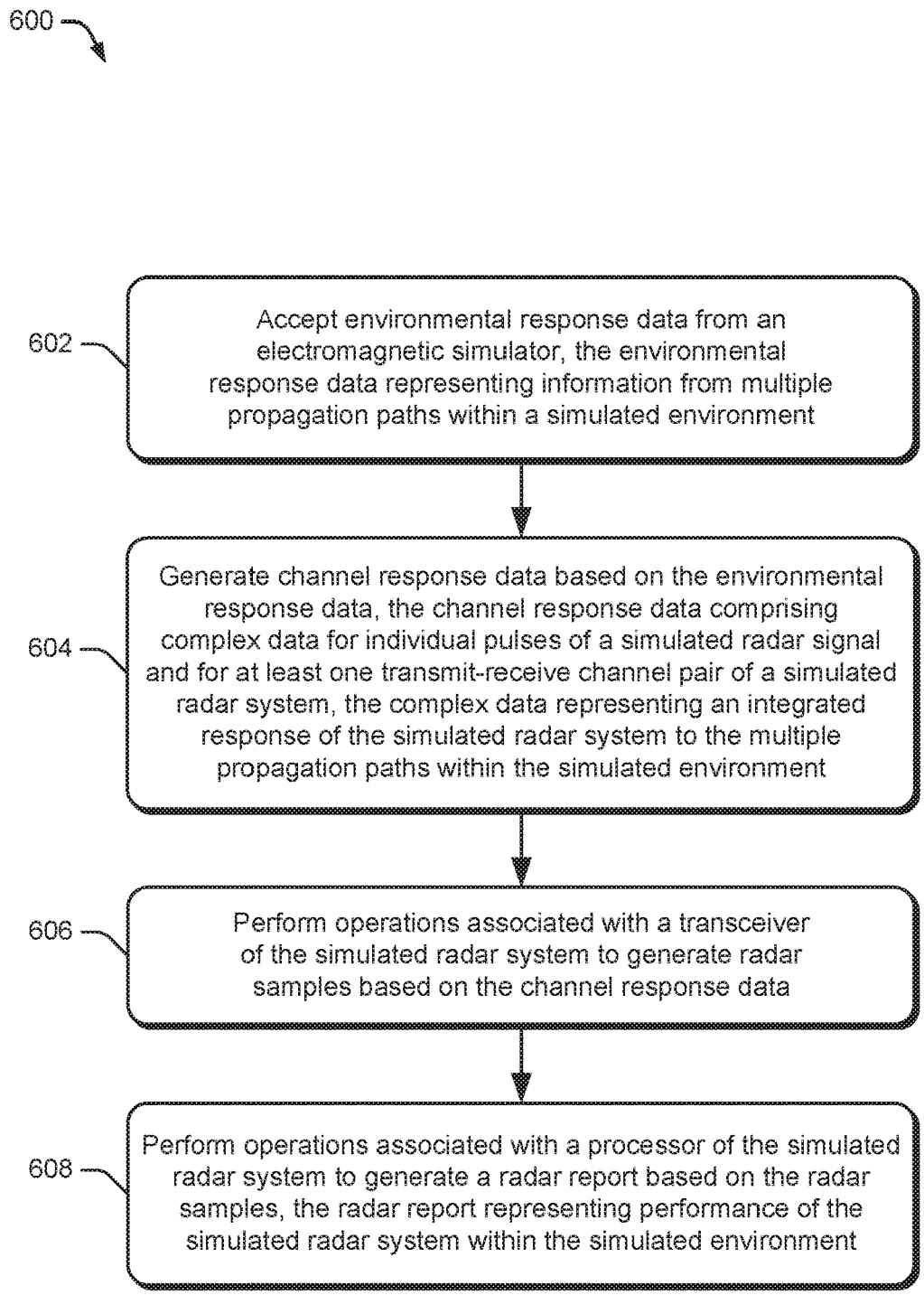
FIG. 6 illustrates an example method performed by a radar simulator.

FIG. 6 depicts an example method 600 for operating a radar simulator 102. Method 600 is shown as sets of operations (or acts) performed but not necessarily limited to the order or combinations in which the operations are shown herein. Further, any of one or more of the operations may be repeated, combined, or reorganized to provide other methods. In portions of the following discussion, reference may be made to the environment 100 of FIG. 1, and entities detailed in FIGS. 1-3, reference to which is made for example only. The techniques are not limited to performance by one entity or multiple entities.

At 602, environmental response data from an electromagnetic simulator is accepted. The environmental response data represents information from multiple propagation paths within a simulated environment. For example, the radar simulator 102 accepts the environmental response data 224 from the electromagnetic simulator 138 of FIG. 2. The environmental response data 224 represents information from multiple propagation paths 204 within the simulated environment 208. The electromagnetic simulator 138 can use ray tracing to determine the multiple propagation paths 204. Example electromagnetic simulators 138 can include, but are not limited to, CarMaker™ and ANSYS™. The electromagnetic simulator 138 may reference some information about the radar system 104 to generate the environmental response data 224, such as the maximum frequency or the pulse-repetition frequency. Example types of environmental response data 224 include propagation data 226 or integrated data 228, as further described with respect to FIG. 2.

At 604, channel response data is generated based on the environmental response data. The channel response data comprises complex data for individual pulses of a simulated radar signal and for at least one transmit-receive channel pair of a simulated radar system. The complex data represents an integrated response of the simulated radar system to the multiple propagation paths within the simulated environment. For example, the interface module 132 generates the channel response data 304 based on the environmental response data 224, as shown in FIG. 3. The channel response data 304 comprises complex data for individual pulses 114 of a simulated radar signal and for at least one transmit-receive channel pair of the radar system 104. The complex data represents an integrated response of the radar system 104 to the multiple propagation paths 204 within the simulated environment 208 of FIG. 2.

At 606, operations associated with a transceiver of the simulated radar system are performed to generate radar samples based on the channel response data. For example, the radar hardware simulator 134 performs operations associated with the transceiver 120 of the radar system 104 to generate the radar samples 306 based on the channel response data 304. Example operations performed by the radar hardware simulator 134 includes amplification, down-conversion, noise injection, filtering, and sampling. The radar samples 306 can be associated with different receive chains of the transceiver 120.

At 608, operations associated with a processor of the simulated radar system are performed to generate a radar report based on the radar samples. The radar report represents performance of the simulated radar system within the simulated environment. For example, the radar software simulator 136 performs operations associated with the processor 122 of the radar system 104 to generate the radar report 302 based on the radar samples 306. The radar report 302 can include a radar data cube 508, an indication of whether or not an object is detected within the simulated environment 208, or characteristics about the object (e.g., location and movement).

Some examples are described below.

Example 1: A method performed by a radar simulator, the method comprising:
    accepting environmental response data from an electromagnetic simulator, the environmental response data representing information from multiple propagation paths within a simulated environment;
    generating channel response data based on the environmental response data, the channel response data comprising complex data for individual pulses of a simulated radar signal and for at least one transmit-receive channel pair of a simulated radar system, the complex data representing an integrated response of the simulated radar system to the multiple propagation paths within the simulated environment;
    performing operations associated with a transceiver of the simulated radar system to generate radar samples based on the channel response data; and
    performing operations associated with a processor of the simulated radar system to generate a radar report based on the radar samples, the radar report representing performance of the simulated radar system within the simulated environment.

Example 2: The method of example 1, wherein:
    the performing the operations associated with the processor comprises detecting at least one object within the simulated environment based on the radar samples; and
    the radar report indicates that the at least one object is detected.

Example 3: The method of example 2, wherein:
    the performing the operations associated with the processor comprises determining an angular position of the at least one object; and
    the radar report includes the angular position of the at least one object.

Example 4: The method of example 3, wherein:
    the performing the operations associated with the processor comprises generating a radar data cube based on the radar samples; and
    processing the radar data cube to detect the at least one object and determine the angular position of the at least one object.

Example 5: The method of example 1, further comprising:
    accepting other environmental response data from another electromagnetic simulator;
    generating other channel response data based on the other environmental response data;
    performing the operations associated with the transceiver of the simulated radar system to generate other radar samples based on the other channel response data; and
    performing the operations associated with the processor of the simulated radar system to generate another radar report based on the other radar samples.

Example 6: The method of example 5, wherein:
    the environmental response data comprises propagation data, the propagation data comprising a list of the multiple propagation paths; and
    the other environmental response data comprises integrated data, the integrated data based on a combination of the multiple propagation paths.

Example 7: The method of example 1, wherein:
    the channel response data comprises channel impulse response data; or
    the channel response data comprises channel frequency response data.

Example 8: The method of example 1, wherein the performing the operations associated with the transceiver comprises:
    generating a waveform signal that has one or more characteristics associated with the simulated radar signal;
    generating at least one simulated radar receive signal based on the waveform signal and the channel response data; and
    generating the radar samples based on the at least one simulated radar receive signal.

Example 9: The method of example 8, wherein the generating the radar samples comprises injecting random noise into the at least one simulated radar receive signal.

Example 10: The method of example 8, wherein the generating the waveform signal comprises providing a recorded waveform of the simulated radar system as the waveform signal.

Example 11: The method of example 8, wherein the generating the waveform signal comprises modifying the waveform signal based on non-linearities and phase noise associated with the simulated radar system.

Example 12: Computer-readable storage media comprising computer-executable instructions that, responsive to execution by a processor, implement:
an interface module configured to:
accept environmental response data from an electromagnetic simulator, the environmental response data representing information from multiple propagation paths within a simulated environment; and
generate channel response data based on the environmental response data, the channel response data comprising complex data for individual pulses of a simulated radar signal and for at least one transmit-receive channel pair of a simulated radar system, the complex data representing an integrated response of the simulated radar system to the multiple propagation paths within the simulated environment; and
a radar hardware simulator configured to perform operations associated with a transceiver of the simulated radar system to generate radar samples based on the channel response data.

Example 13: The computer-readable storage media of example 12, wherein the computer-executable instructions implement a radar software simulator responsive to execution by the processor, the radar software simulator configured to:
perform operations associated with a processor of the simulated radar system to generate a radar report based on the radar samples, the radar report representing performance of the simulated radar system within the simulated environment.

Example 14: The computer-readable storage media of example 13, wherein the radar software simulator is configured to:
generate a radar data cube based on the radar samples;
detect at least one object within the simulated environment based on the radar data cube; and
determine a relative location of the at least one object based on the radar data cube.

Example 15: The computer-readable storage media of example 12, wherein:
the interface module is configured to:
accept other environmental response data from another electromagnetic simulator; and
generate other channel response data based on the other environmental response data; and
the radar hardware simulator is configured to perform the operations associated with the transceiver of the simulated radar system to generate other radar samples based on the other channel response data.

Example 16: The computer-readable storage media of example 15, wherein:
the environmental response data comprises propagation data, the propagation data comprising a list of the multiple propagation paths; and
the other environmental response data comprises integrated data, the integrated data based on a combination of the multiple propagation paths.

Example 17: The computer-readable storage media of example 12, wherein:

the channel response data comprises channel impulse response data; or
the channel response data comprises channel frequency response data.

Example 18: The computer-readable storage media of example 12, wherein the radar hardware simulator is configured to simulate non-linearities and phase noise associated with the simulated radar system.

Example 19: The computer-readable storage media of example 12, wherein the radar hardware simulator is configured to reference a recorded waveform of the simulated radar system to generate the radar samples.

Example 20: A system comprising:
means for accepting environmental response data from an electromagnetic simulator, the environmental response data representing information from multiple propagation paths within a simulated environment;
means for generating channel response data based on the environmental response data, the channel response data comprising complex data for individual pulses of a simulated radar signal and for at least one transmit-receive channel pair of a simulated radar system, the complex data representing an integrated response of the simulated radar system to the multiple propagation paths within the simulated environment;
means for performing operations associated with a transceiver of the simulated radar system to generate radar samples based on the channel response data; and
means for performing operations associated with a processor of the simulated radar system to generate a radar report based on the radar samples, the radar report representing performance of the simulated radar system within the simulated environment.

While various embodiments of the disclosure are described in the foregoing description and shown in the drawings, it is to be understood that this disclosure is not limited thereto but may be variously embodied to practice within the scope of the following claims. From the foregoing description, it will be apparent that various changes may be made without departing from the spirit and scope of the disclosure as defined by the following claims.

The invention claimed is:
1. A method performed by a radar simulator, the method comprising:
accepting environmental response data from an electromagnetic simulator, the environmental response data representing information from multiple propagation paths within a simulated environment;
generating channel response data based on the environmental response data, the channel response data comprising complex data for individual pulses of a simulated radar signal and for multiple transmit-receive channel pairs of a simulated radar system, the complex data representing an integrated response of the simulated radar system to the multiple propagation paths within the simulated environment, the integrated response including a phase shift applied to the environmental response data based on a position of a transmitting subarray or a receiving subarray that define each transmit-receive channel pair of the multiple transmit-receive channel pairs, wherein generating the integrated response further includes weighting each propagation path by a complex radiation pattern of the transmitting subarray and receiving subarray of the antenna array;

performing operations associated with a transceiver of the simulated radar system to generate radar samples based on the channel response data; and performing operations associated with a processor of the simulated radar system to generate a radar report based on the radar samples, the radar report used to identify potential problems or verify requirements of the simulated radar system within the simulated environment.

2. The method of claim 1, wherein:

the performing the operations associated with the processor comprises detecting at least one object within the simulated environment based on the radar samples; and the radar report indicates that the at least one object is detected.

3. The method of claim 2, wherein:

the performing the operations associated with the processor comprises determining an angular position of the at least one object; and the radar report includes the angular position of the at least one object.

4. The method of claim 3, wherein:

the performing the operations associated with the processor comprises generating a radar data cube based on the radar samples; and processing the radar data cube to detect the at least one object and determine the angular position of the at least one object.

5. The method of claim 1, further comprising:

accepting other environmental response data from another electromagnetic simulator;

generating other channel response data based on the other environmental response data;

performing the operations associated with the transceiver of the simulated radar system to generate other radar samples based on the other channel response data; and performing the operations associated with the processor of the simulated radar system to generate another radar report based on the other radar samples.

6. The method of claim 5, wherein:

the environmental response data comprises propagation data, the propagation data comprising a list of the multiple propagation paths; and the other environmental response data comprises integrated data, the integrated data based on a combination of the multiple propagation paths.

7. The method of claim 1, wherein:

the channel response data comprises channel impulse response data; or the channel response data comprises channel frequency response data.

8. The method of claim 1, wherein the performing the operations associated with the transceiver comprises:

generating a waveform signal that has one or more characteristics associated with the simulated radar signal;

generating at least one simulated radar receive signal based on the waveform signal and the channel response data; and generating the radar samples based on the at least one simulated radar receive signal.

9. The method of claim 8, wherein the generating the radar samples comprises injecting random noise into the at least one simulated radar receive signal.

10. The method of claim 8, wherein the generating the waveform signal comprises providing a recorded waveform of the simulated radar system as the waveform signal.

11. The method of claim 8, wherein the generating the waveform signal comprises modifying the waveform signal based on non-linearities and phase noise associated with the simulated radar system.

12. Non-transitory computer-readable storage media comprising computer-executable instructions that, responsive to execution by a processor, implement:

an interface module configured to:

accept environmental response data from an electromagnetic simulator, the environmental response data representing information from multiple propagation paths within a simulated environment; and generate channel response data based on the environmental response data, the channel response data comprising complex data for individual pulses of a simulated radar signal and for multiple transmit-receive channel pairs of a simulated radar system, the complex data representing an integrated response of the simulated radar system to the multiple propagation paths within the simulated environment, the integrated response including a phase shift applied to the environmental response data based on a position of a transmitting subarray or a receiving subarray that define each transmit-receive channel pair of the multiple transmit-receive channel pairs, wherein generating the integrated response further includes weighting each propagation path by a complex radiation pattern of the transmitting subarray and receiving subarray of the antenna array; and a radar hardware simulator configured to:

perform operations associated with a transceiver of the simulated radar system to generate radar samples based on the channel response data; and perform operations associated with a processor of the simulated radar system to generate a radar report based on the radar samples, the radar report used to identify potential problems or verify requirements of the simulated radar system within the simulated environment.

13. The non-transitory computer-readable storage media of claim 12, wherein the computer-executable instructions implement a radar software simulator responsive to execution by the processor, the radar software simulator configured to:

perform operations associated with a processor of the simulated radar system to generate a radar report based on the radar samples, the radar report representing performance of the simulated radar system within the simulated environment.

14. The non-transitory computer-readable storage media of claim 13, wherein the radar software simulator is configured to:

generate a radar data cube based on the radar samples;

detect at least one object within the simulated environment based on the radar data cube; and determine a relative location of the at least one object based on the radar data cube.

15. The non-transitory computer-readable storage media of claim 12, wherein:

the interface module is configured to:

accept other environmental response data from another electromagnetic simulator; and generate other channel response data based on the other environmental response data; and the radar hardware simulator is configured to perform the operations associated with the transceiver of the simulated radar system to generate other radar samples based on the other channel response data.

16. The non-transitory computer-readable storage media of claim 15, wherein:
the environmental response data comprises propagation data, the propagation data comprising a list of the multiple propagation paths; and
the other environmental response data comprises integrated data, the integrated data based on a combination of the multiple propagation paths.

17. The non-transitory computer-readable storage media of claim 12, wherein:
the channel response data comprises channel impulse response data; or
the channel response data comprises channel frequency response data.

18. The non-transitory computer-readable storage media of claim 12, wherein the radar hardware simulator is configured to simulate non-linearities and phase noise associated with the simulated radar system.

19. The non-transitory computer-readable storage media of claim 12, wherein the radar hardware simulator is configured to reference a recorded waveform of the simulated radar system to generate the radar samples.

20. A system comprising:
means for accepting environmental response data from an electromagnetic simulator, the environmental response data representing information from multiple propagation paths within a simulated environment;
means for generating channel response data based on the environmental response data, the channel response data comprising complex data for individual pulses of a simulated radar signal and multiple transmit-receive channel pairs of a simulated radar system, the complex data representing an integrated response of the simulated radar system to the multiple propagation paths within the simulated environment, the integrated response including a phase shift applied to the environmental response data based on a position of a transmitting subarray or a receiving subarray that define each transmit-receive channel pair of the multiple transmit-receive channel pairs, wherein generating the integrated response further includes weighting each propagation path by a complex radiation pattern of the transmitting subarray and receiving subarray of the antenna array;
means for performing operations associated with a transceiver of the simulated radar system to generate radar samples based on the channel response data; and
means for performing operations associated with a processor of the simulated radar system to generate a radar report based on the radar samples, the radar report used to identify potential problems or verify requirements of the simulated radar system within the simulated environment.

* * * * *